(12) United States Patent  (10) Patent No.: US 9,019,672 B2
Chen  (45) Date of Patent: Apr. 28, 2015

(54) CHIP WITH ELECTROSTATIC DISCHARGE PROTECTION FUNCTION

(71) Applicant: United Microelectronics Corporation, Hsinchu (TW)

(72) Inventor: Shao-Ping Chen, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 177 days.

(21) Appl. No.: 13/943,804

(22) Filed: Jul. 17, 2013

(65) Prior Publication Data

US 2015/0022920 A1    Jan. 22, 2015

(51) Int. Cl.
*H02H 9/04* (2006.01)
*H01L 27/02* (2006.01)
*H01L 29/78* (2006.01)

(52) U.S. Cl.
CPC ........... *H02H 9/046* (2013.01); *H01L 27/0248* (2013.01); *H01L 29/785* (2013.01)

(58) Field of Classification Search
CPC ... H02H 9/046; H01L 27/0248; H01L 29/785
USPC .......................................................... 361/56
See application file for complete search history.

(56) References Cited

U.S. PATENT DOCUMENTS

| | | |
|---|---|---|
| 5,637,900 A | 6/1997 | Ker |
| 5,744,842 A | 4/1998 | Ker |
| 5,959,820 A | 9/1999 | Ker |
| 6,043,138 A | 3/2000 | Ibok |
| 6,465,768 B1 | 10/2002 | Ker |
| 6,492,216 B1 | 12/2002 | Yeo |
| 6,724,677 B1 | 4/2004 | Su |
| 6,909,149 B2 | 6/2005 | Russ |
| 6,921,963 B2 | 7/2005 | Krivokapic |
| 7,009,252 B2 | 3/2006 | Lin |
| 7,027,276 B2 | 4/2006 | Chen |
| 7,087,477 B2 | 8/2006 | Fried |
| 7,091,551 B1 | 8/2006 | Anderson |
| 7,205,612 B2 | 4/2007 | Cai |
| 7,247,887 B2 | 7/2007 | King |
| 7,250,658 B2 | 7/2007 | Doris |
| 7,309,626 B2 | 12/2007 | Ieong |
| 7,352,034 B2 | 4/2008 | Booth, Jr. |
| 7,368,761 B1 | 5/2008 | Lai |
| 7,470,570 B2 | 12/2008 | Beintner |
| 7,531,437 B2 | 5/2009 | Brask |
| 7,569,857 B2 | 8/2009 | Simon et al. |
| 7,672,100 B2 | 3/2010 | Van Camp |
| 7,919,816 B2 | 4/2011 | Gossner |
| 8,178,862 B2 | 5/2012 | Colinge |
| 2003/0076636 A1 | 4/2003 | Ker |
| 2004/0195624 A1 | 10/2004 | Liu |

(Continued)

*Primary Examiner* — Scott Bauer
(74) *Attorney, Agent, or Firm* — Ding Yu Tan

(57) ABSTRACT

A chip with electrostatic discharge protection function includes two power rails, a pin, a P-type FinFET, an N-type FinFET, two Fin-resistors, two diodes and an ESD unit. The pin is electrically connected to one power rail sequentially through one Fin-resistor and the P-type FinFET and electrically connected to the other power rail sequentially through the other Fin-resistor and the N-type FinFET. The two FinFETs are configured to have the control terminals thereof for receiving a transmission signal. The pin is further electrically connected to the two power rails through the two diodes, respectively. The ESD unit, electrically connected between the first and second power rails, is configured to provide an ESD path between the first and second power rails.

7 Claims, 3 Drawing Sheets

(56) References Cited

U.S. PATENT DOCUMENTS

| | | |
|---|---|---|
| 2005/0051825 A1 | 3/2005 | Fujiwara |
| 2006/0099830 A1 | 5/2006 | Walther |
| 2006/0267102 A1 | 11/2006 | Cheng |
| 2006/0273372 A1* | 12/2006 | Voldman et al. .............. 257/308 |
| 2006/0286729 A1 | 12/2006 | Kavalieros |
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2010/0296213 A1* | 11/2010 | Lee et al. ........................ 361/56 |

\* cited by examiner

CHIP WITH ELECTROSTATIC DISCHARGE PROTECTION FUNCTION

FIELD OF THE INVENTION

The present invention relates to a chip, and more particularly to a chip with electrostatic discharge (ESD) protection function.

BACKGROUND OF THE INVENTION

With the development of technology and the progress of semiconductor manufacturing technique, the size of the internal electronic components in a chip is shrunk to be just dozens of nanometers. Thus, some unexpected sudden voltage or current may cause damage on these tiny-sized electronic components. For example, these electronic components of a chip may be damaged by an electrostatic discharge (ESD) derived from an external pin thereof.

Thus, for all the chip design companies, it is quite important to design a chip capable of preventing from being damaged by an ESD.

SUMMARY OF THE INVENTION

The present invention provides a chip with electrostatic discharge (ESD) protection function, which includes a first power rail, a second power rail, a pin, a P-type FinFET, a first Fin-resistor, an N-type FinFET, a second Fin-resistor, a first diode, a second diode and an ESD unit. The first power rail is electrically connected to a source voltage. The second power rail is electrically connected to a reference voltage. The P-type FinFET includes a first terminal, a second terminal and a first control terminal. The P-type FinFET is configured to have the first terminal thereof electrically connected to the first power rail and to have the first control terminal thereof configured for receiving a transmission signal. The first Fin-resistor includes a third terminal, a fourth terminal and a second control terminal. The first Fin-resistor is configured to have the third terminal and the second control terminal thereof both electrically connected to the second terminal and to have the fourth terminal thereof electrically connected to the pin. The N-type FinFET includes a fifth terminal, a sixth terminal and a third control terminal. The N-type FinFET is configured to have the sixth terminal thereof electrically connected to the second power rail and to have the third control terminal thereof configured for receiving the transmission signal. The second Fin-resistor includes a seventh terminal, an eighth terminal and a fourth control terminal. The second Fin-resistor is configured to have the eighth terminal and the fourth control terminal thereof both electrically connected to the fifth terminal, and to have the seventh terminal thereof electrically connected to the pin. The first diode is configured to have an anode thereof electrically connected to the pin and a cathode thereof electrically connected to the first power rail. The second diode is configured to have an anode thereof electrically connected to the second power rail and to have a cathode thereof electrically connected to the pin. The ESD unit, electrically connected between the first and second power rails, is configured to provide an ESD path between the first and second power rails.

In summary, by disposing a pin of a chip with an ESD circuit including two Fin-resistors, two diodes and an ESD unit, an ESD path is built for the chip of present invention when an ESD event occurs at the pin and consequentially the core circuit in the chip can be prevented from being damaged by an ESD current. In addition, because the Fin-resistor is in a high-impedance state when an ESD event occurs at the pin, the P-type FinFET and the N-type FinFET, corporately implementing an output buffer for the transmission signal, are also prevented from being damaged by an ESD current.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
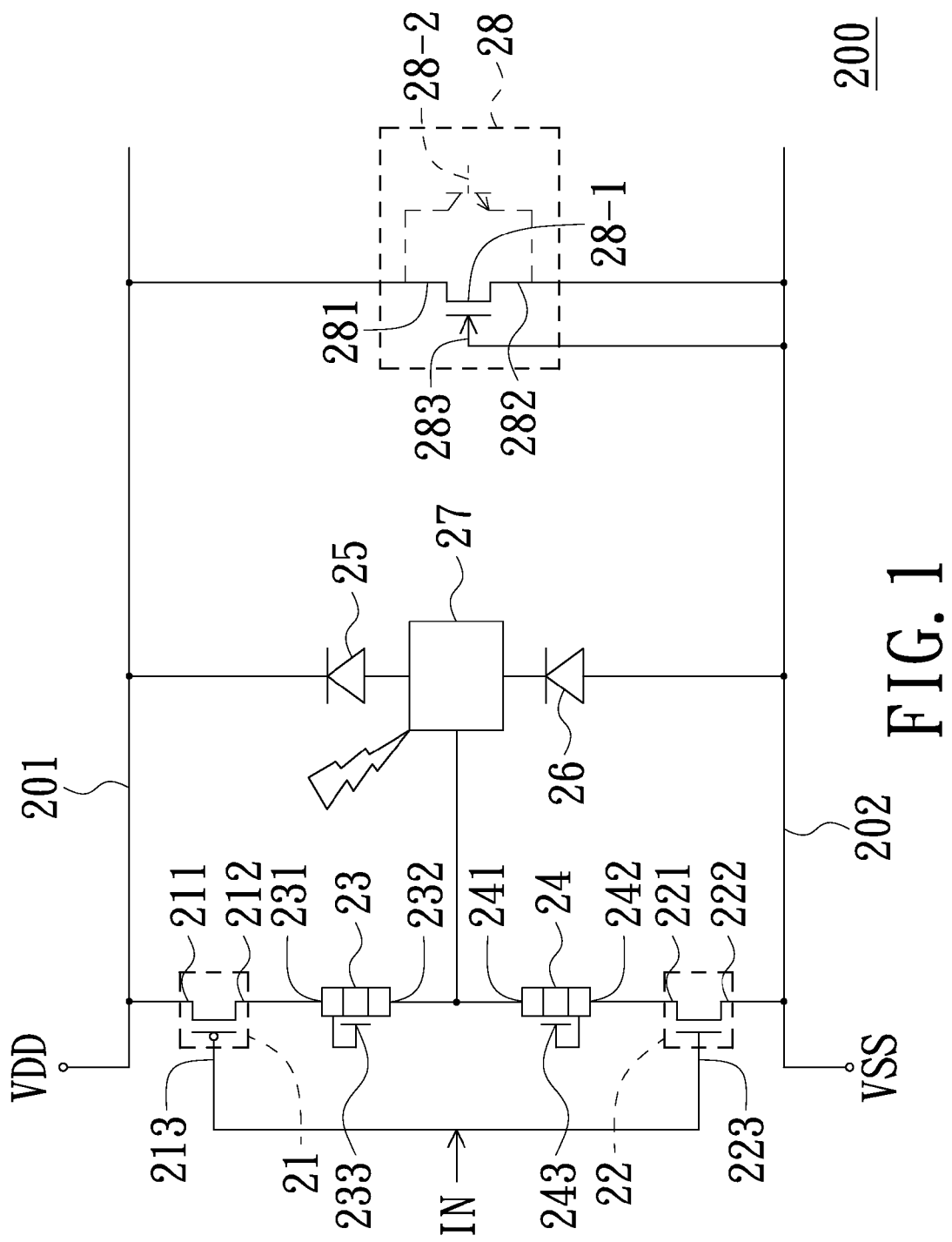
FIG. 1 is a schematic view depicting a chip with electrostatic discharge (ESD) protection function in accordance with an embodiment of the present invention.

FIG. 1 is a schematic view of a chip with electrostatic discharge (ESD) protection function in accordance with an embodiment of the present invention. As shown, the chip 200 in this embodiment includes two power rails 201, 202, a pin 27, a P-type FinFET 21, an N-type FinFET 22, two Fin-resistors 23, 24, two diodes 25, 26 and an ESD unit 28. The power rails 201, 202 are electrically connected to a source voltage VDD and a reference voltage VSS, respectively. The P-type FinFET 21 includes a first terminal 211, a second terminal 212 and a control terminal 213. The P-type FinFET 21 is configured to have the first terminal 211 thereof electrically connected to the power rail 201 and the control terminal 213 thereof configured for receiving a transmission signal IN. The Fin-resistor 23 includes a first terminal 231, a second terminal 232 and a control terminal 233. The Fin-resistor 23 is configured to have the first terminal 231 and the control terminal 233 thereof both electrically connected to the second terminal 212 of the P-type FinFET 21 and the second terminal 232 thereof electrically connected to the pin 27.

Figure 3:
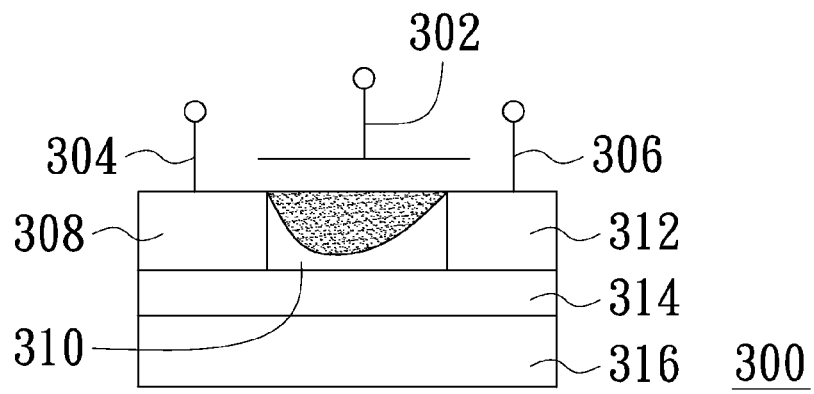
FIG. 3 is a schematic cross-sectional view illustrating the N-type Fin-resistor in a high-impedance state shown in FIG. 2.
Figure 4:
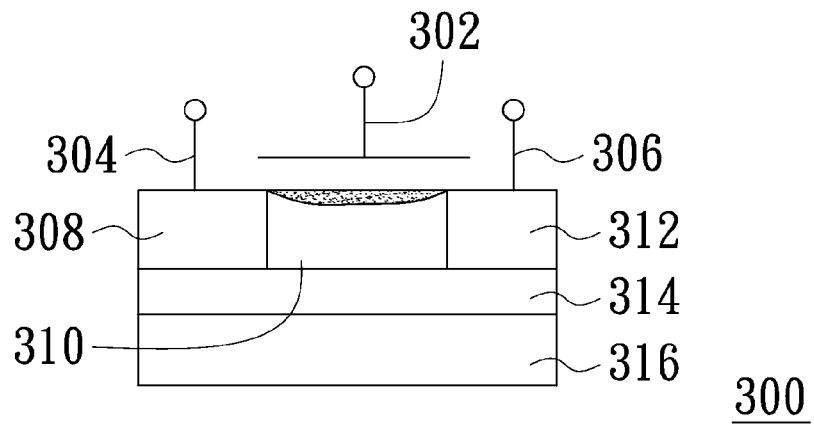
FIG. 4 is a schematic cross-sectional view illustrating the N-type Fin-resistor in a low-impedance state shown in FIG. 2.

The N-type FinFET 22 includes a first terminal 221, a second terminal 222 and a control terminal 223. The N-type FinFET 22 is configured to have the second terminal 222 thereof electrically connected to the power rail 202 and the control terminal 223 thereof configured for receiving a transmission signal IN. The Fin-resistor 24 includes a first terminal 241, a second terminal 242 and a control terminal 243. The Fin-resistor 24 is configured to have the second terminal 242 and the control terminal 243 thereof both electrically connected to the first terminal 221 of the N-type FinFET 22 and the first terminal 241 thereof electrically connected to the pin 27. The diode 25 is configured to have an anode thereof electrically connected to the pin 27 and a cathode thereof electrically connected to the power rail 201. The diode 26 is configured to have an anode thereof electrically connected to the power rail 202 and a cathode thereof electrically connected to the pin 27. The ESD unit 28 is electrically connected between the power rails 201, 202 and configured to provide an ESD path therebetween. In this embodiment, the ESD unit 28 is implemented by an N-type transistor 28-1, which has a first terminal 281, a second terminal 282 and a control terminal 283. The N-type transistor 28-1 is configured to have the first terminal 281 thereof electrically connected to the power rail 201, and the second terminal 282 and the control terminal 283 thereof both electrically connected to the power rail 202. Additionally, in this embodiment, each of the Fin-resistors 23, 24 is implemented by an N-type Fin-resistor, as illustrated in FIGS. 2-4.

Figure 2:
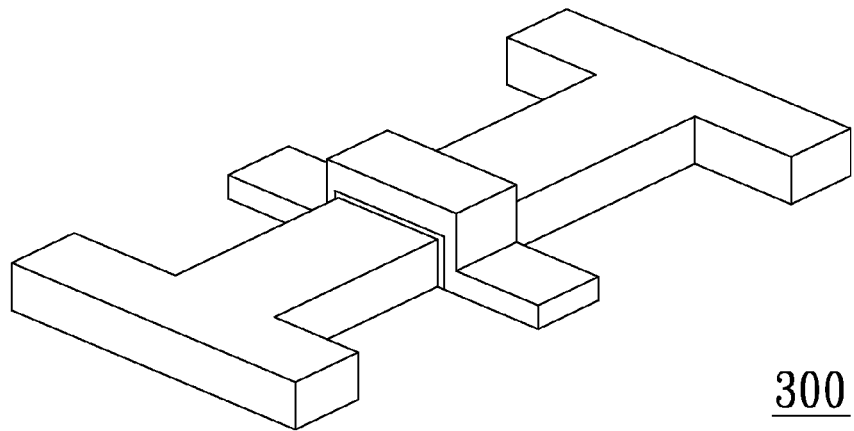
FIG. 2 is a schematic view illustrating a 3D structure of an N-type Fin-resistor.

FIG. 2 is a schematic view of a 3D structure of an N-type Fin-resistor 300; FIG. 3 is a schematic cross-sectional view of the N-type Fin-resistor 300 in a high-impedance state; and FIG. 4 is a schematic cross-sectional view of the N-type Fin-resistor 300 in a low-impedance state. As shown in FIGS. 3 and 4, the N-type Fin-resistor 300 has a control terminal 302 (i.e. a gate), a first terminal 304 (i.e. a source/drain) and a second terminal 306 (i.e. another source/drain). In addition, the N-type Fin-resistor 300 includes two N-type high-doping regions 308, 312, an N-type low-doping region 310, an insulating layer 314 and a substrate 316. Specifically, the N-type Fin-resistor 300 is in the high-impedance state as illustrated in FIG. 3 when being configured to have a gate voltage much less than a drain voltage thereof; alternatively, the N-type Fin-resistor 300 is in the low-impedance state as illustrated in FIG. 4 when being configured to have a gate voltage and a drain voltage thereof close to each other.

Please refer back to FIG. 1. When an ESD event occurs at the pin 27, the voltage at the second terminal 232 of the Fin-resistor 23 is much greater than that at the first terminal 231 and the control terminal 233 thereof, and accordingly, the second terminal 232 of the Fin-resistor 23 is formed to be a drain and the Fin-resistor 23 is in the high-impedance state. Based on the same manner, when an ESD event occurs at the pin 27, the voltage at the first terminal 241 of the Fin-resistor 24 is much greater than that at the second terminal 242 and the control terminal 243 thereof, and accordingly, the first terminal 241 of the Fin-resistor 24 is formed to be a drain and the Fin-resistor 24 is in the high-impedance state. Meanwhile, a parasitic bipolar junction transistor (BJT) 28-2 corresponding to the N-type transistor 28-1 functioning as the ESD unit 28 is turned on by a trigger of the ESD event and thereby an ESD path is formed between the power rails 201, 202.

Thus, the ESD current derived from the pin 27 may be delivered to the power rail 202 sequentially through the power rail 201 and the N-type transistor 28-1. In addition, due to the ESD current derived from the pin 27 may be inhibited by the Fin-resistors 23, 24, the ESD current can be prevented from damaging the P-type FinFET 21, the N-type FinFET 22 and the front-end circuit (i.e. the core circuit of the chip 200, not shown) for providing the transmission signal IN. In addition, if no ESD event occurs at the pin 27 and the transmission signal IN has a high level, the N-type FinFET 22 is turned on and the voltage at the floating-state first terminal 241 of the Fin-resistor 24 is pulled to have a value close to that of the voltage at the second terminal 242 and thereby the Fin-resistor 24 is in the low-impedance state. Accordingly, the high-level transmission signal IN can be transmitted to the pin 27 normally. Alternatively, if no ESD event occurs at the pin 27 and the transmission signal IN has a low level, the P-type FinFET 21 is turned on and the voltage at the floating-state second terminal 232 of the Fin-resistor 23 is pulled to have a value close to that of the voltage at the first terminal 231, and the Fin-resistor 23 is thereby in the low-impedance state. Accordingly, the low-level transmission signal IN can be transmitted to the pin 27 normally.

As described above, each of the Fin-resistors 23, 24 is implemented by an N-type Fin-resistor, but it is not used to limit the invention. In fact, each of the Fin-resistors 23, 24 can also be implemented by a P-type Fin-resistor. The operation principle of the P-type Fin-resistor is similar to that of the N-type Fin resistor. The connecting relation to the other components is the same between the P-type and N-type Fin-resistors and is omitted for the sake of brevity. In addition, the ESD unit 28 can also be implemented by a P-type transistor, but the control terminal thereof is electrically connected to the power rail 201, and the connecting relation of the other terminals of the P-type transistor is the same that of the first and second terminals 281, 282 of the N-type transistor 28-1 of the illustrated embodiment.

Figure 5:
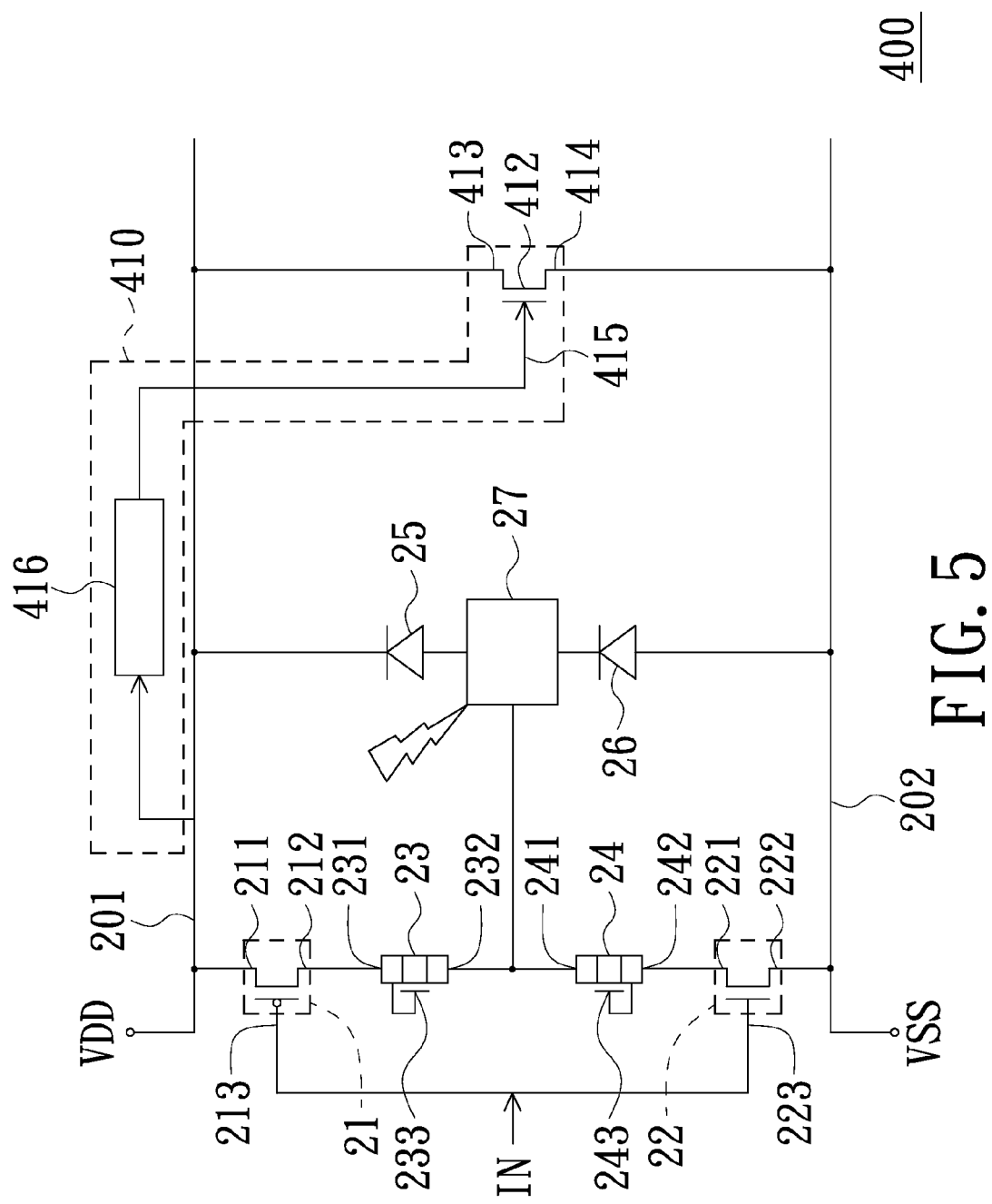
FIG. 5 is a schematic view depicting a chip with ESD protection function in accordance with another embodiment of the present invention.

FIG. 5 is a schematic view of a chip with ESD protection function in accordance with another embodiment of the present invention. As shown, the main difference between the chip 400 in this embodiment and the chip 200 in the aforementioned embodiment is that the ESD unit 410 in the chip 400 is implemented by an N-type transistor 412 and an ESD detection circuit 416. The N-type transistor 412 is configured to have a first terminal 413 thereof electrically connected to the power rail 201 and a second terminal 414 thereof electrically connected to the power rail 202. The ESD detection circuit 416 is configured to have an input terminal thereof electrically connected to the power rail 201 and an output terminal thereof electrically connected to a control terminal 415 of the N-type transistor 412. Specifically, the ESD detection circuit 416 is configured to detect whether if there exists an ESD event or not at the pin 27 according to a voltage variation on the power rail 201, and accordingly determine whether or not to provide an enable signal to the control terminal 415 of the N-type transistor 412 to turn on the N-type transistor 412. Certainly, the N-type transistor 412 can be replaced by a P-type transistor, and the connecting relation of the terminals of the P-type transistor is the same as that of the terminals of the N-type transistor 412.

In summary, the present invention discloses an ESD circuit by disposing a pin of a chip to include of two Fin-resistors, two diodes and an ESD unit, an ESD path is built when an ESD event occurs at the pin and consequentially the core circuit in the chip can be prevented from being damaged by an ESD current. In addition, because the Fin-resistor is in a high-impedance state when an ESD event occurs at the pin, the P-type FinFET and the N-type FinFET, corporately implementing an output buffer for the transmission signal, are also prevented from being damaged by an ESD current.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A chip with electrostatic discharge (ESD) protection function, comprising:
a first power rail electrically connected to a source voltage;
a second power rail electrically connected to a reference voltage;
a pin;

a P-type FinFET comprising a first terminal, a second terminal and a first control terminal, the P-type FinFET being configured to have the first terminal thereof electrically connected to the first power rail, and the first control terminal thereof configured for receiving a transmission signal;

a first Fin-resistor comprising a third terminal, a fourth terminal and a second control terminal, the first N-type Fin-resistor being configured to have the third terminal and the second control terminal thereof both electrically connected to the second terminal, and the fourth terminal thereof electrically connected to the pin;

an N-type FinFET comprising a fifth terminal, a sixth terminal and a third control terminal, the N-type FinFET being configured to have the sixth terminal thereof electrically connected to the second power rail, and the third control terminal thereof configured for receiving the transmission signal;

a second Fin-resistor comprising a seventh terminal, an eighth terminal and a fourth control terminal, the second N-type Fin-resistor being configured to have the eight terminal and the fourth control terminal thereof both electrically connected to the fifth terminal, and the seventh terminal thereof electrically connected to the pin;

a first diode configured to have an anode thereof electrically connected to the pin and a cathode thereof electrically connected to the first power rail;

a second diode configured to have an anode thereof electrically connected to the second power rail and a cathode thereof electrically connected to the pin; and an ESD unit, electrically connected between the first and second power rails, configured to provide an ESD path between the first and second power rails.

2. The chip with ESD protection function according to claim 1, wherein each of the first and second Fin-resistors is an N-type Fin-resistor.

3. The chip with ESD protection function according to claim 1, wherein each of the first and second Fin-resistors is a P-type Fin-resistor.

4. The chip with ESD protection function according to claim 1, wherein the ESD unit comprises:

an N-type transistor comprising a ninth terminal, a tenth terminal and a fifth control terminal, the N-type transistor being configured to have the ninth terminal thereof electrically connected to the first power rail, and the tenth terminal and the fifth control terminal thereof both electrically connected to the second power rail.

5. The chip with ESD protection function according to claim 1, wherein the ESD unit comprises:

a P-type transistor comprising a ninth terminal, a tenth terminal and a fifth control terminal, the P-type transistor being configured to have the ninth terminal and the fifth terminal thereof both electrically connected to the first power rail, and the tenth terminal thereof electrically connected to the second power rail.

6. The chip with ESD protection function according to claim 1, wherein the ESD unit comprises:

an N-type transistor comprising a ninth terminal, a tenth terminal and a fifth control terminal, the N-type transistor being configured to have the ninth terminal thereof electrically connected to the first power rail and the tenth terminal thereof electrically connected to the second power rail; and an ESD detection circuit, electrically connected between the first power rail and the fifth control terminal, configured to detect whether there exists an ESD event or not according to a voltage variation on the first power rail, and accordingly determine whether or not to provide an enable signal to the fifth control terminal to turn on the N-type transistor.

7. The chip with ESD protection function according to claim 1, wherein the ESD unit comprises:

a P-type transistor comprising a ninth terminal, a tenth terminal and a fifth control terminal, the P-type transistor being configured to have the ninth terminal thereof electrically connected to the first power rail and the tenth terminal thereof electrically connected to the second power rail; and an ESD detection circuit, electrically connected between the first power rail and the fifth control terminal, configured to detect whether there exists an ESD event or not according to a voltage variation on the first power rail and accordingly determine whether or not to provide an enable signal to the fifth control terminal to turn on the P-type transistor.

* * * * *